United States Patent
Jung et al.

(10) Patent No.: US 10,490,495 B2
(45) Date of Patent: Nov. 26, 2019

(54) COMPARISON CIRCUIT INCLUDING INPUT SAMPLING CAPACITOR AND IMAGE SENSOR INCLUDING THE SAME

(71) Applicant: SAMSUNG ELECTRONICS CO., LTD., Suwon-si (KR)

(72) Inventors: Yunhwan Jung, Hwasung-si (KR); Sunyool Kang, Hwasung-si (KR); Jaehong Kim, Hwasung-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 192 days.

(21) Appl. No.: 15/662,630

(22) Filed: Jul. 28, 2017

(65) Prior Publication Data

US 2018/0033722 A1 Feb. 1, 2018

(30) Foreign Application Priority Data

Jul. 28, 2016 (KR) ........................ 10-2016-0096339

(51) Int. Cl.
| | |
|---|---|
| *H01L 23/522* | (2006.01) |
| *H04N 5/378* | (2011.01) |
| *H04N 5/357* | (2011.01) |
| *H01L 27/08* | (2006.01) |
| *H03K 4/08* | (2006.01) |

(52) U.S. Cl.
CPC ...... *H01L 23/5223* (2013.01); *H01L 23/5225* (2013.01); *H01L 27/0805* (2013.01); *H03K 4/08* (2013.01); *H04N 5/3575* (2013.01); *H04N 5/378* (2013.01)

(58) Field of Classification Search
CPC ... H04N 5/378; H04N 5/3575; H01L 23/5223
See application file for complete search history.

(56) References Cited

U.S. PATENT DOCUMENTS

| | | |
|---|---|---|
| 6,680,499 B2 | 1/2004 | Kumura et al. |
| 6,700,146 B2 | 3/2004 | Ito |
| 7,259,956 B2 | 8/2007 | Fong et al. |
| (Continued) | | |

FOREIGN PATENT DOCUMENTS

| | | |
|---|---|---|
| JP | 8-274167 A | 10/1996 |
| KR | 10-2002-0009169 A | 2/2002 |
| (Continued) | | |

*Primary Examiner* — Thanh Luu
(74) *Attorney, Agent, or Firm* — Sughrue Mion, PLLC

(57) ABSTRACT

A comparison circuit that includes an input sampling capacitor and an image sensor including the same are provided. The comparison circuit includes an amplifier configured to receive a pixel signal and a ramp signal to perform a correlated double sampling operation, a first pixel capacitor connected to the amplifier through a first floating node and configured to transmit the pixel signal, a first ramp capacitor connected to the amplifier through a second floating node and configured to transmit the ramp signal, a second pixel capacitor connected in parallel to the first pixel capacitor, and a second ramp capacitor connected in parallel to the first ramp capacitor, wherein the second pixel capacitor is formed between the first floating node and first peripheral routing lines, and the second ramp capacitor is formed between the second floating node and second peripheral routing lines.

17 Claims, 9 Drawing Sheets

(56) References Cited

U.S. PATENT DOCUMENTS

| | | |
|---|---|---|
| 9,218,870 B2 | 12/2015 | Saito |
| 9,252,104 B2 | 2/2016 | Zhu et al. |
| 2002/0075736 A1 | 6/2002 | Kumura et al. |
| 2003/0141528 A1 | 7/2003 | Ito |
| 2005/0135042 A1 | 6/2005 | Chiu-Kit Fong et al. |
| 2009/0128991 A1 | 5/2009 | Mauritzson |
| 2011/0168782 A1 | 7/2011 | Bergler et al. |
| 2012/0133808 A1* | 5/2012 | Park .................... G01J 1/46 348/294 |
| 2013/0215307 A1* | 8/2013 | Park .................... H03K 5/1252 348/302 |
| 2015/0023090 A1 | 1/2015 | Saito |
| 2015/0028452 A1 | 1/2015 | Zhu et al. |

FOREIGN PATENT DOCUMENTS

| | | |
|---|---|---|
| KR | 10-2007-0075017 A | 7/2007 |
| KR | 10-2012-0017967 A | 2/2012 |

\* cited by examiner

COMPARISON CIRCUIT INCLUDING INPUT SAMPLING CAPACITOR AND IMAGE SENSOR INCLUDING THE SAME

CROSS-REFERENCE TO THE RELATED APPLICATION

This application claims priority from Korean Patent Application No. 10-2016-0096339, filed on Jul. 28, 2016, in the Korean Intellectual Property Office, the entire contents of which are hereby incorporated by reference.

BACKGROUND

Apparatuses consistent with example embodiments relate to image sensors, and more particularly, to a comparison circuit including an input sampling capacitor and an image sensor including the same.

An image sensor converts an optical image into an electrical signal. As a computer industry and a communication industry develop, the demand for an image sensor having improved performance in various fields such as a digital camera, a camcorder, a personal communication system (PCS), a game machine, a security camera, a medical micro camera, etc. is being increased.

The image sensor includes a charge coupled device (CCD) and a complementary metal-oxide-semiconductor (CMOS) image sensor. Because the CMOS image sensor has a simple driving method and can integrate a signal processing circuit in a single chip, the CMOS image sensor is of advantage to miniaturization of the product. The CMOS image sensor has very low power consumption and thus can be easily applied to the product having a limited battery capacity. Because the CMOS image sensor can be manufactured using a compatible CMOS process technology, a manufacturing cost of the CMOS image sensor may be lowered. Thus, the use of the CMOS image sensor is rapidly being increased according to a technology development and an implementation capability of the CMOS image sensor.

The CMOS image sensor includes a comparison circuit. The comparison circuit compares a signal sensed in a sensor array of the CMOS image sensor and a ramp signal generated in a ramp generator to generate a digital signal. The signal sensed in the sensor array and the ramp signal are affected by a plurality of capacitors while they are transmitted to an amplifier of the comparison circuit. The capacitors include predetermined capacitors and parasitic capacitors. Transmission efficiency in the comparison circuit is determined according to a ratio of the predetermined capacitors to the parasitic capacitors.

SUMMARY

According to an aspect of an example embodiment, there is provide a comparison circuit including an amplifier configured to receive a pixel signal and a ramp signal to perform a correlated double sampling operation, a first pixel capacitor connected to the amplifier through a first floating node and configured to transmit the pixel signal, a first ramp capacitor connected to the amplifier through a second floating node and configured to transmit the ramp signal, a second pixel capacitor connected in parallel to the first pixel capacitor, and a second ramp capacitor connected in parallel to the first ramp capacitor. The second pixel capacitor may be formed between the first floating node and first peripheral routing lines, and the second ramp capacitor may be formed between the second floating node and second peripheral routing lines.

According to an aspect of another example embodiment, there is provide an image sensor including a sensor array configured to convert a light into an electrical signal to generate a pixel signal, a ramp signal generator configured to generate a ramp signal, and a comparison circuit configured to receive the pixel signal and the ramp signal to perform a correlated double sampling operation. The comparison circuit may include an amplifier configured to perform the correlated double sampling operation, a first pixel capacitor configured to be connected to the amplifier through a first floating node and to transmit the pixel signal, a first ramp capacitor configured to be connected to the amplifier through a second floating node and to transmit the ramp signal, a second pixel capacitor configured to be connected in parallel to the first pixel capacitor, and a second ramp capacitor configured to be connected in parallel to the first ramp capacitor. The second pixel capacitor is formed between the first floating node and first peripheral routing lines, and the second ramp capacitor is formed between the second floating node and second peripheral routing lines.

According to an aspect of another example embodiment, there is provide a comparison circuit including an amplifier configured to receive a pixel signal and a ramp signal to perform a correlated double sampling operation, an input capacitor comprising a pixel capacitor and a ramp capacitor and having a predetermined capacitance, and a plurality of parasitic capacitors, wherein a parasitic capacitor, among the parasitic capacitors, formed at a floating node between the input capacitor and the amplifier is converted into an input capacitor by changing a layout of the comparison circuit to increase capacitance of the input capacitor, the changing the layout of the comparison circuit comprising connecting the parasitic capacitor formed at the floating node in parallel to the input capacitor.

BRIEF DESCRIPTION OF THE FIGURES

Example embodiments will be described below in more detail with reference to the accompanying drawings, in which.

DETAILED DESCRIPTION OF EXAMPLE EMBODIMENTS

Figure 1:
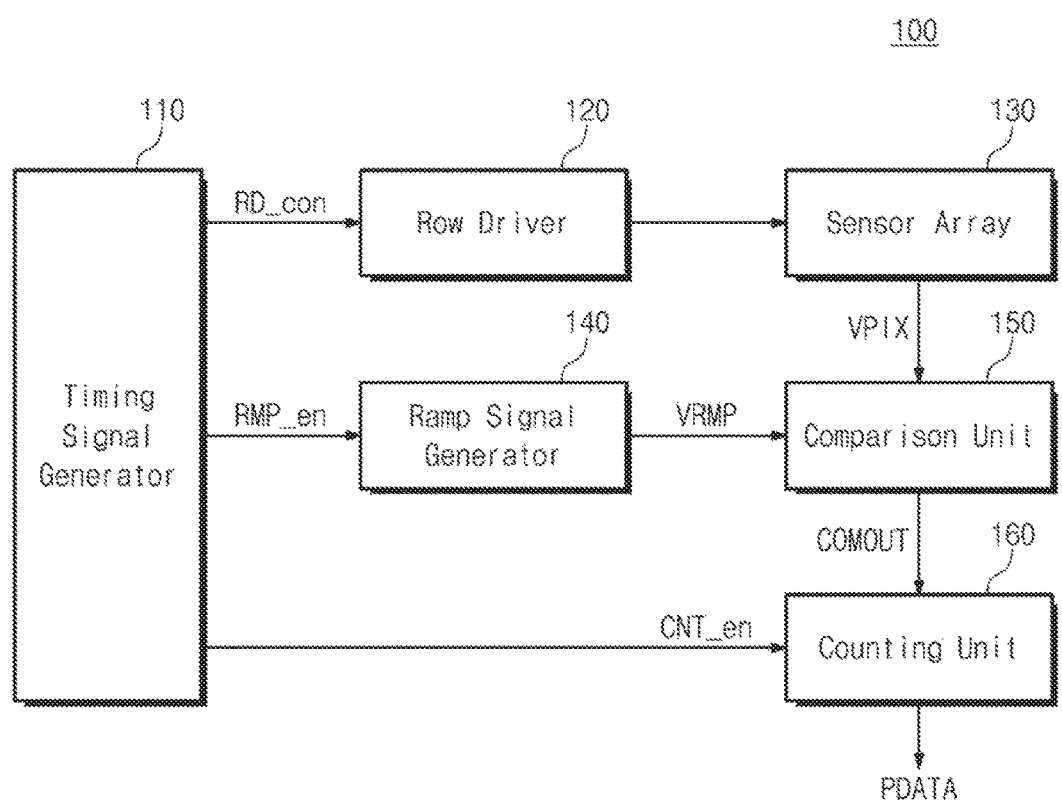
FIG. 1 is a block diagram illustrating an image sensor according to an example embodiment.

Below, example embodiments of the inventive concept will be described in detail with reference to the accompanying drawings. This inventive concept may, however, be embodied in many different forms and should not be construed as limited to the example embodiments set forth herein. Rather, the example embodiments are provided so that this disclosure will be thorough and complete, and will fully convey the scope of the inventive concept to those skilled in the art. In the drawings, the size and relative sizes of layers and regions may be exaggerated for clarity. Like numbers refer to like elements throughout.

FIG. 1 is a block diagram illustrating an image sensor 100 according to an example embodiment. Referring to FIG. 1, the image sensor 100 may include a timing signal generator 110, a row driver 120, a sensor array 130, a ramp signal generator 140, a comparison unit 150, and a counting unit 160.

The timing signal generator 110 generates a timing signal in response to a control signal for generation of timing signals. The timing signal generator 110 may generate a row driver control signal (RD_con) that controls an operation of the row driver 120. The timing signal generator 110 may generate a ramp enable signal (RMP_en) that controls an operation of the ramp signal generator 140. The timing signal generator 110 may generate a counter enable signal (CNT_en) that controls an operation of the counting unit 160.

The row driver 120 sequentially drives a plurality of rows of the sensor array 130 in response to the row driver control signal (RD_con). The row driver 120 may be electrically connected to the plurality of rows of the sensor array 130. Pixels of a selected row may convert a sensed light into a pixel signal VPIX which is an electrical signal.

The sensor array 130 includes a plurality of optical sensing devices. The sensor array 130 includes a plurality of rows and a plurality of columns. The plurality of optical sensing devices may be disposed at positions in which the rows cross the columns.

An optical sensing device may be a photo diode, a photo transistor, a photo gate, a pinned photo diode (PPD), or combinations thereof. For example, the optical sensing device may have a 4-transistor structure including a photo diode, a transmission transistor, a reset transistor, an amplifying transistor, and a select transistor. The optical sensing device may have a 1-transistor structure, a 3-transistor structure, a 5-transistor structure, or a structure in which a plurality of pixels share some transistors. The sensor array 130 may convert a sensed light into a pixel signal VPIX to transmit the converted pixel signal VPIX to the comparison unit 150.

The ramp signal generator 140 generates a ramp signal VRMP in response to the ramp enable signal (RMP_en). A voltage level of the ramp signal VRMP may increase or decrease in proportion to the elapsed time. The ramp signal VRMP may be transmitted to the comparison unit 150 to be used to convert an analog signal into a digital signal.

The comparison unit 150 receives the ramp signal VRMP and the pixel signal VPIX. The comparison unit 150 compares the ramp signal VRMP and the pixel signal VPIX to transmit a comparison signal COMOUT to the counting unit 160. The comparison unit 150 may perform an operation of a correlated double sampling (CDS) to reduce a noise. Thus, the comparison unit 150 may further include a CDS circuit that extracts a signal having no noise from a difference between the ramp signal VRMP and the pixel signal VPIX.

The counting unit 160 may generate a counting signal corresponding to the ramp signal VRMP in response to the counter enable signal (CNT_en). When the ramp signal VRMP begins, the counting unit 160 may begin a counting operation. The counting unit 160 may convert the comparison signal COMOUT received from the comparison unit 150 into digital information to output pixel data PDATA.

The comparison unit 150 may include a plurality of comparators. Each comparator may receive the ramp signal VRMP and the pixel signal VPIX. Each comparator may include an amplifier that compares the ramp signal VRMP and the pixel signal VPIX. Each of the ramp signal VRMP and the pixel signal VPIX is transmitted to the amplifier through an input capacitor. Each comparator may include various parasitic capacitors in addition to the input capacitor. The parasitic capacitor may be formed at a floating node between the input capacitor of each comparator and the amplifier. Each comparator may convert the parasitic capacitor formed at the floating node into the input capacitor by changing a layout of the comparator. Thus, in each comparator, capacitance of the parasitic capacitor is reduced and capacitance of the input capacitor increases.

A transmission efficiency of each comparator depends on capacitance of the capacitors. For example, if capacitance of the input capacitor increases, a transmission efficiency of each comparator may increase. If capacitance of the parasitic capacitor increases, a transmission efficiency of each comparator may be reduced. Thus, in each comparator, if capacitance of the parasitic capacitor is reduced and capacitance of the input capacitor increases, a transmission efficiency of each comparator may increase.

Figure 2:
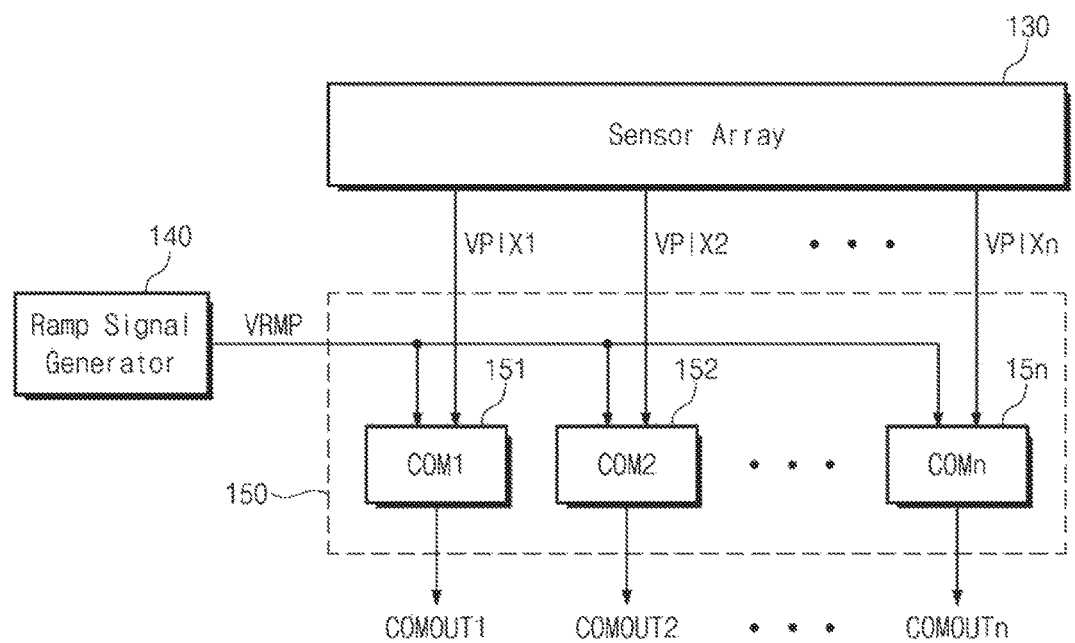
FIG. 2 is a view illustrating a comparison unit illustrated in FIG. 1 in detail.

FIG. 2 is a view illustrating a comparison unit 150 illustrated in FIG. 1 in detail. Referring to FIG. 2, the sensor array 130 may include a plurality of columns. The comparison unit 150 may include a plurality of comparators (151 to 15n) connected to the plurality of columns of the sensor array 130. The ramp signal generator 140 may generate the ramp signal VRMP in response to the ramp enable signal (RMP_en). The generated ramp signals VRMP may be equally supplied to the respective comparators (151 to 15n).

Each of pixels of the sensor array 130 may convert a light into an electrical signal. Pixels connected to a selected row of the sensor array 130 may output pixel signals (VPIX1 to VPIXn). Each of the comparators (151 to 15n) compares the ramp signal VRMP with each of the pixel signals (VPIX1 to VPIXn) to output comparator signals (COMOUT1 to COMOUTn). The first comparator 151 may compare the ramp signal VRMP with the first pixel signal VPIX1 to output the first comparator signal COMOUT1. The second comparator 152 may compare the ramp signal VRMP with the second pixel signal VPIX2 to output the second comparator signal COMOUT2. The nth comparator 15n may compare the ramp signal VRMP with the nth pixel signal VPIXn to output the nth comparator signal COMOUTn.

Each of the comparators (151 to 15n) may perform a correlated double sampling (CDS) operation. Each of the comparators (151 to 15n) may perform the CDS operation using the ramp signal VRMP and each of the pixel signals (VPIX1 to VPIXn). The generated comparator signals (COMOUT1 to COMOUTn) are transmitted to counters (not illustrated) included in the counting unit 160. The counters included in the counting unit 160 may count the respective comparator signals (COMOUT1 to COMOUTn) to convert the counted value into a digital code.

According to an example embodiment, the comparators (151 to 15n) may receive the ramp signal VRMP and respective pixel signals (VPX1 to VPXn). In each of the comparators (151 to 15n), the pixel signal VPX and the ramp signal VRMP are transmitted to an amplifier through an input capacitor. Each of the comparators (151 to 15n) may include various parasitic capacitors in addition to the input capacitor. The parasitic capacitor may be formed at a floating node between the input capacitor of each of the comparators (151 to 15n) and the amplifier. Each of the comparators (151 to 15n) may convert the parasitic capacitor formed at the floating node into the input capacitor through a change of the layout. Thus, capacitance of the parasitic capacitor may be reduced and capacitance of the input capacitor may increase in each of the comparators (151 to 15n).

Transmission efficiency of each of the comparators (151 to 15n) is determined by capacitance of capacitors. If capacitance of the input capacitor increases, transmission efficiency of each of the comparators (151 to 15n) may increase. If capacitance of the parasitic capacitor increases, transmission efficiency of each of the comparators (151 to 15n) may be reduced. Thus, if capacitance of the parasitic capacitor is reduced and capacitance of the input capacitor increases in each of the comparators (151 to 15n), transmission efficiency of each of the comparators (151 to 15n) may be improved.

Figure 3:
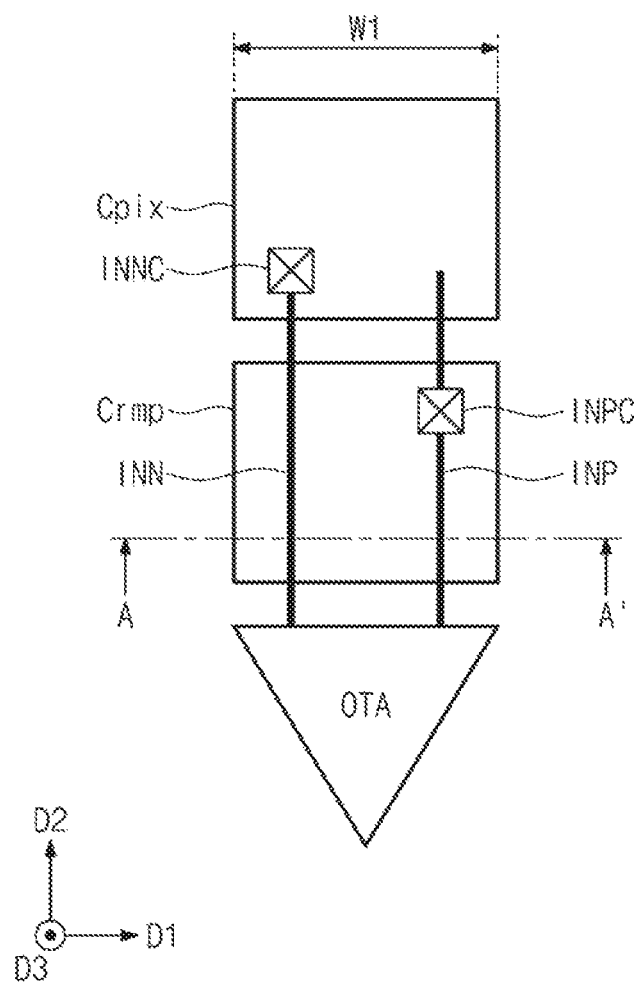
FIG. 3 is a view conceptually illustrating a layout of one of comparators illustrated in FIG. 2.

FIG. 3 is a view conceptually illustrating a layout of one of comparators illustrated in FIG. 2. Referring to FIG. 3, the comparator 151 may include a pixel capacitor Cpix, a ramp capacitor Crmp and an amplifier OTA. The pixel capacitor Cpix and the ramp capacitor Crmp are input capacitors configured to have predetermined capacitance.

The pixel capacitor Cpix may be configured to have a predetermined capacitance. For example, the pixel capacitor Cpix may be configured to have a fixed first width W1 in a first direction D1 and to have a predetermined length in a second direction D2 perpendicular to the first direction D1 according to the predetermined charge capacitance. The pixel capacitor Cpix may be stacked in a third direction D3 perpendicular to the first and second directions D1 and D2. However, the method of forming the pixel capacitor Cpix according to example embodiments is not limited thereto. The pixel capacitor Cpix may be connected to the amplifier OTA through a floating node INN and a floating node contact INNC.

The ramp capacitor Crmp may be configured to have a predetermined charge capacitance. For example, the ramp capacitor Crmp may be configured to have the fixed first width W1 in the first direction D1 and to have a predetermined length in the second direction D2 perpendicular to the first direction D1 according to a predetermined charge capacitance. The ramp capacitor Crmp may be stacked in the third direction D3 perpendicular to the first and second directions D1 and D2. However, the method of forming the ramp capacitor Crmp according to example embodiments is not limited thereto. The ramp capacitor Crmp may be connected to the amplifier OTA through a floating node INP and a floating node contact INPC.

The pixel capacitor Cpix and the ramp capacitor Crmp may be disposed in parallel along the second direction D2. A length of the floating node INN may be formed the same as a length of the floating node INP to reduce an effect of a parasitic capacitance. A parasitic capacitor may be formed between the floating node INN, peripheral routing lines and the floating node INP. The amplifier OTA may include a plurality of transistors.

Figure 4:
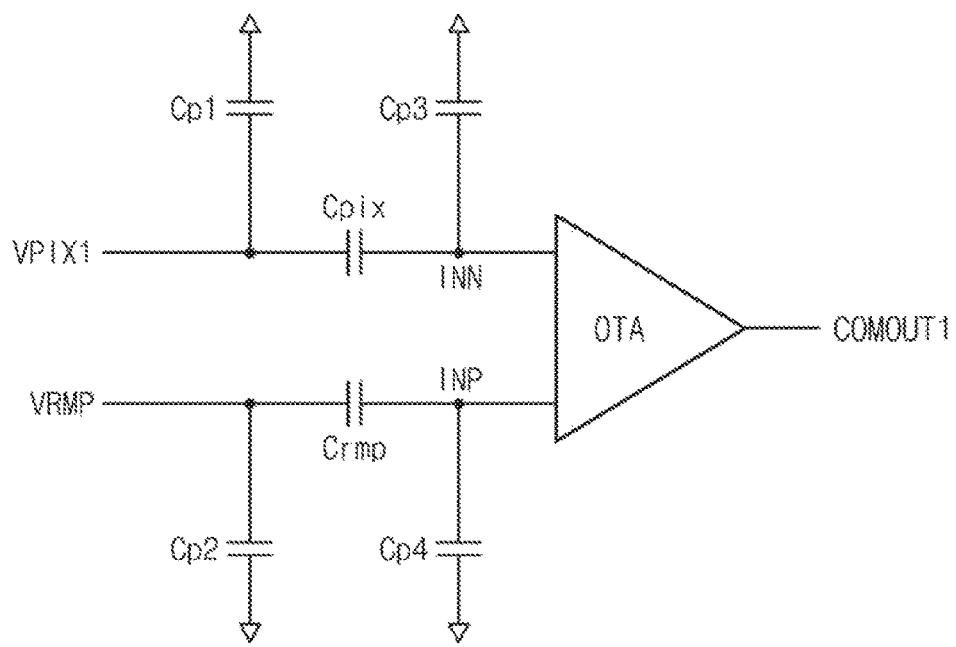
FIG. 4 is a circuit diagram illustrating a connection relation of capacitors in one of comparators illustrated in FIG. 2.

FIG. 4 is a circuit diagram illustrating a connection relation of capacitors in one of comparators illustrated in FIG. 2. Referring to FIG. 4, a comparator 151a may include a pixel capacitor Cpix, a ramp capacitor Crmp and an amplifier OTA. The pixel capacitor Cpix and the ramp capacitor Crmp are predetermined input capacitors for improving a noise characteristic. The first pixel signal VPIX1 is transmitted to the amplifier OTA through the pixel capacitor Cpix. The ramp signal VRMP is transmitted to the amplifier OTA through the ramp capacitor Crmp. The pixel capacitor Cpix, the ramp capacitor Crmp, the amplifier OTA, a floating node INN, and a floating node INP of FIG. 4 correspond to the pixel capacitor Cpix, the ramp capacitor Crmp, the amplifier OTA, the floating node INN, and the floating node INP of FIG. 3, respectively.

The comparator 151a may include parasitic capacitors Cp1, Cp2, Cp3 and Cp4 in addition to the predetermined pixel capacitor Cpix and the predetermined ramp capacitor Crmp. The first parasitic capacitor Cp1 may be formed between an input stage of the first pixel signal VPIX1 and a ground terminal. The second parasitic capacitor Cp2 may be formed between an input stage of the ramp signal VRMP and the ground terminal. The third parasitic capacitor Cp3 may be formed between the floating node INN and the ground terminal. The fourth parasitic capacitor Cp4 may be formed between the floating node INP and the ground terminal.

Transmission efficiency of the comparator 151a is determined by capacitance of capacitors. If capacitances of the pixel capacitor Cpix and the ramp capacitor Crmp as the input capacitor increase, transmission efficiency of comparator 151a may increase. If capacitances of the parasitic capacitors Cp1, Cp2, Cp3 and Cp4 increase, transmission efficiency of the comparator 151a may be reduced. Thus, to increase transmission efficiency of the comparator 151a, a design change of reducing capacitances of the parasitic capacitors Cp1, Cp2, Cp3 and Cp4 is needed.

Figure 5:
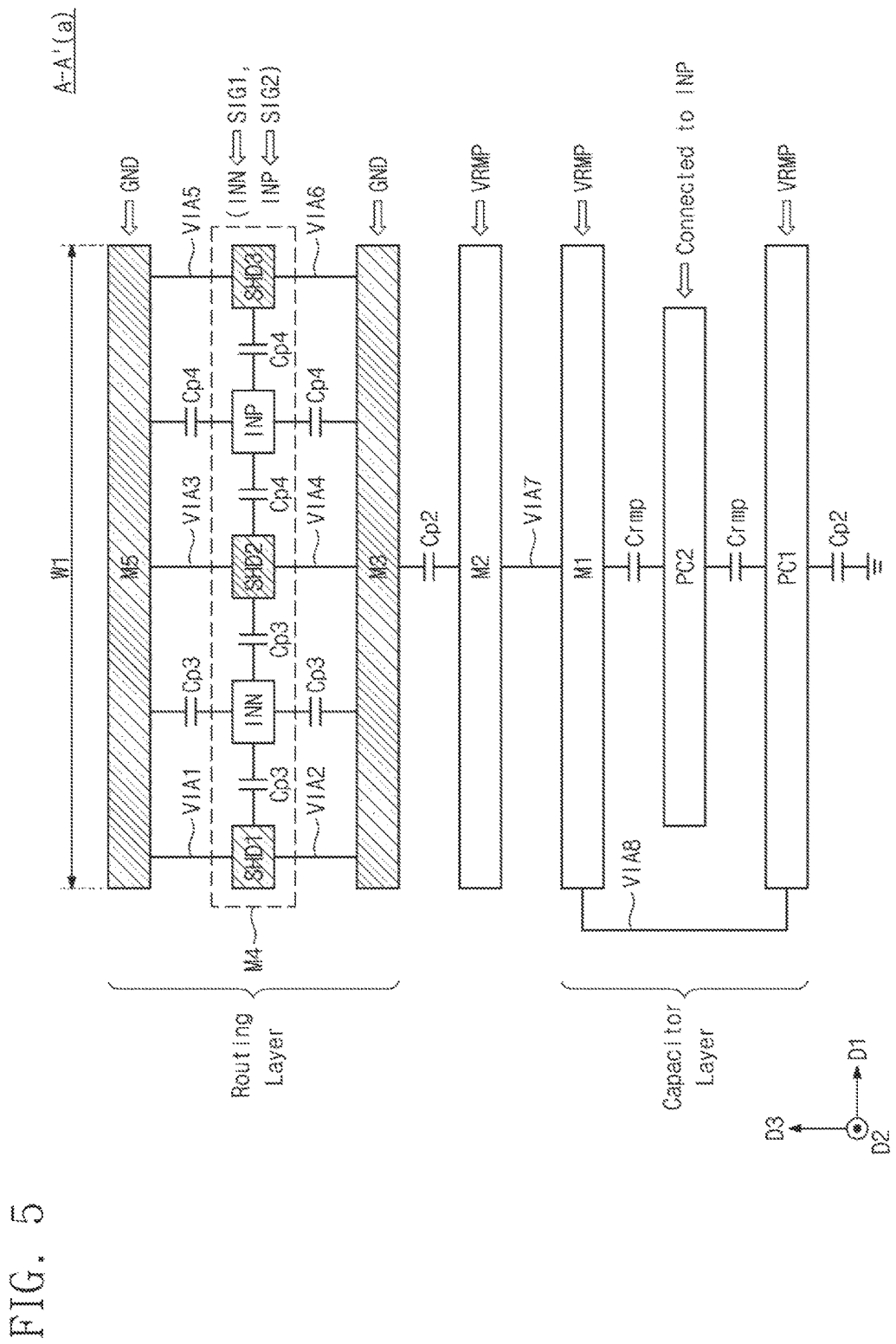
FIG. 5 is a conceptual diagram corresponding to a cross section taken along the line A-A' in FIG. 3 to implement a connection relation of capacitors illustrated in FIG. 4.

FIG. 5 is a conceptual diagram corresponding to a cross section taken along the line A-A' in FIG. 3 to implement a connection relation of capacitors illustrated in FIG. 4. Referring to FIGS. 3 through 5, the pixel capacitor Cpix and the ramp capacitor Crmp of the comparator 151a may be formed by a plurality of layers stacked in the third direction D3. The comparator 151a may include a capacitor layer and a routing layer. The capacitor layer may include a first poly layer PC1, a second poly layer PC2, and a first metal layer M1. The routing layer may include a third metal layer M3, a fourth metal layer M4, and a fifth metal layer M5. A second metal layer M2 may be selectively formed to minimize an effect between the capacitor layer and the routing layer. An insulating layer may be formed between each layer.

FIG. 5 illustrates a conceptual layout and a thickness of each layer may be changed depending on a design. A distance between the layers may be changed depending on a design. A width of each layer may be limited within the first width W1.

The capacitor layer may be formed to provide the predetermined input capacitors Crmp and Cpix. The ramp capacitor Crmp may be formed between the first poly layer PC1 and the second poly layer PC2. The ramp capacitor Crmp may also be formed between the second poly layer PC2 and the first metal layer M1. The first poly layer PC1 and the first metal layer M1 may be connected to each other through an eighth via (VIA8). The ramp signal VRMP may be input to the first poly layer PC1 and the first metal layer M1. The second poly layer PC2 may be connected to the floating node INP. The second parasitic capacitor Cp2 may be formed between the first poly layer PC1 and the ground terminal.

Although not illustrated in the drawing, the pixel capacitor Cpix may be formed similar to the ramp capacitor Crmp. The pixel capacitor Cpix may be formed between the first poly layer PC1 and the second poly layer PC2. The pixel capacitor Cpix may also be formed between the second poly capacitor PC2 and the first metal layer M1. The first poly layer PC1 and the first metal layer M1 may be connected to each other through another via. The first pixel signal VPIX1 may be input to the first poly layer PC1 and the first metal layer M1. The second poly layer PC2 may be connected to the floating node INN. The second parasitic capacitor Cp2 may be formed between the first poly layer PC1 and the ground terminal. The pixel capacitor Cpix may be disposed parallel to the ramp capacitor Crmp in the second direction D2. In FIG. 3, a cross section taken along the line A-A' crosses the ramp capacitor Crmp. Thus, FIG. 5 does not illustrate a cross section of the pixel capacitor Cpix.

The floating nodes (INN, INP) may be formed on the routing layer. The fourth metal layer M4 may include the floating nodes (INN, INP). The floating nodes (INN, INP) may be shielded by the third through fifth metal layers M3, M4 and M5. The floating node INN may be disposed between the third metal layer M3, the fifth metal layer M5, a first shield line SHD1, and a second shield line SHD2. The first shield line SHD1 may be connected to the fifth metal layer M5 through a first via VIA1. The first shield line SHD1 may be connected to the third metal layer M3 through a second via VIA2. The second shield line SHD2 may be connected to the fifth metal layer M5 through a third via VIA3. The second shield line SHD2 may be connected to the third metal layer M3 through a fourth via VIA4. The third metal layer M3, the fifth metal layer M5, the first shield line SHD1, and second shield line SHD2 may be connected to the ground terminal. Because of this, the third parasitic capacitor Cp3 may be formed between the floating node INN and the ground terminal.

The floating node INP may be disposed between the third metal layer M3, the fifth metal layer M5, the second shield line SHD2 and a third shield line SHD3. The second shield line SHD2 may be connected to the fifth metal layer M5 through the third via VIA3. The second shield line SHD2 may be connected to the third metal layer M3 through the fourth via VIA4. The third shield line SHD3 may be connected to the fifth metal layer M5 through a fifth via VIA5. The third shield line SHD3 may be connected to the third metal layer M3 through a sixth via VIA6. The third metal layer M3, the fifth metal layer M5, the second shield line SHD2, and third shield line SHD3 may be connected to the ground terminal. Because of this, the fourth parasitic capacitor Cp4 may be formed between the floating node INP and the ground terminal.

Because the third metal layer M3 is connected to the ground terminal, the second parasitic capacitor Cp2 may be formed between the second metal layer M2 and the third metal layer M3.

In FIG. 5, because the floating nodes (INN, INP) are shielded by the metal layers (M3, M5) and shield lines (SHD1, SHD2, SHD3) that are connected to the ground terminal, the parasitic capacitors Cp3 and Cp4 may be formed between the floating node INN and the ground terminal and between the floating node INP and the ground terminal, respectively. Thus, to increase transmission efficiency of the comparator 151a, a design change of reducing capacitances of the parasitic capacitors Cp3 and Cp4 is needed.

Figure 6:
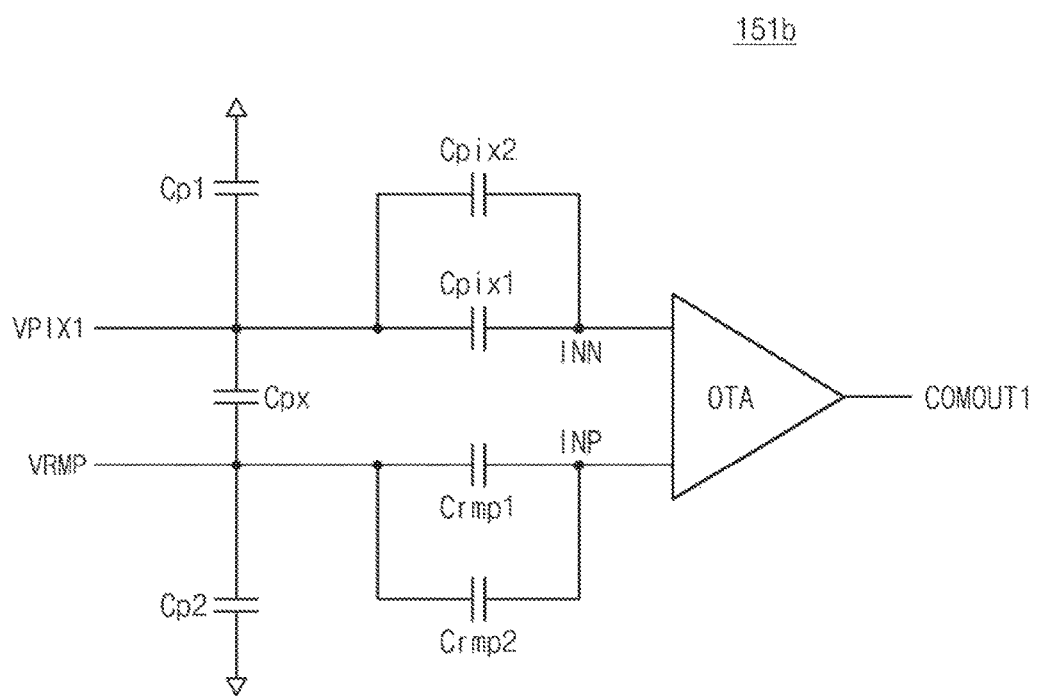
FIG. 6 is a circuit diagram illustrating a connection relation of capacitors according to an example embodiment in one of comparators illustrated in FIG. 2.

FIG. 6 is a circuit diagram illustrating a connection relation of capacitors according to an example embodiment in one of comparators illustrated in FIG. 2. Referring to FIG. 6, a comparator 151b may include pixel capacitors Cpix1 and Cpix2, ramp capacitors Crmp1 and Crmp2, and an amplifier OTA. The first pixel capacitor Cpix1 and the first ramp capacitor Crmp1 are predetermined input capacitors to improve a noise characteristic. The second pixel capacitor Cpix2 and the second ramp capacitor Crmp2 are input capacitors formed by changing a layout of parasitic capacitors.

The first pixel signal VPIX1 may be transmitted to the amplifier OTA through the pixel capacitors Cpix1 and Cpix2. The first pixel capacitor Cpix1, the first ramp capacitor Crmp1, the amplifier OTA, the floating node INN, and the floating node INP of FIG. 6 correspond to the pixel capacitor Cpix, the ramp capacitor Crmp, the amplifier OTA, the floating node INN, and the floating node INP of FIG. 3, respectively.

The comparator 151b may include parasitic capacitors Cp1 and Cp2 in addition to the predetermined pixel capacitors Cpix1 and Cpix2 and the predetermined ramp capacitors Crmp1 and Crmp2. The first parasitic capacitor Cp1 may be formed between an input stage of the first pixel signal VPIX1 and a ground terminal. The second parasitic capacitor Cp2 may be formed between an input stage of the ramp signal VRMP and the ground terminal.

Transmission efficiency of the comparator 151b is determined depending on capacitances of capacitors. If capacitances of the pixel capacitors Cpix1 and Cpix2 and the ramp capacitors Crmp1 and Crmp2 increase, transmission efficiency of the comparator 151b may increase. If capacitances of the parasitic capacitors Cp1 and Cp2 increase, transmission efficiency of the comparator 151b may be reduced.

The first pixel capacitor Cpix1 and the first ramp capacitor Crmp1 are capacitors having a predetermined capacitance. The first pixel capacitor Cpix1 and the first ramp capacitor Crmp1 may correspond to the pixel capacitor Cpix and the ramp capacitor Crmp of FIG. 3, respectively.

The second pixel capacitor Cpix2 and the second ramp capacitor Crmp2 are input capacitors formed by changing a layout of parasitic capacitors. The second pixel capacitor Cpix2 may be formed by changing a layout of the third parasitic capacitor Cp3 of FIG. 4. The second ramp capacitor Crmp2 may be formed by changing a layout of the fourth parasitic capacitor Cp4 of FIG. 4. Thus, capacitance between the input stage of the first pixel signal VPIX1 and the floating node INN may increase. Capacitance between the input stage of the ramp signal VRMP and the floating node INP may increase. Consequently, transmission efficiency of the comparator 151b may increase.

Figure 7:
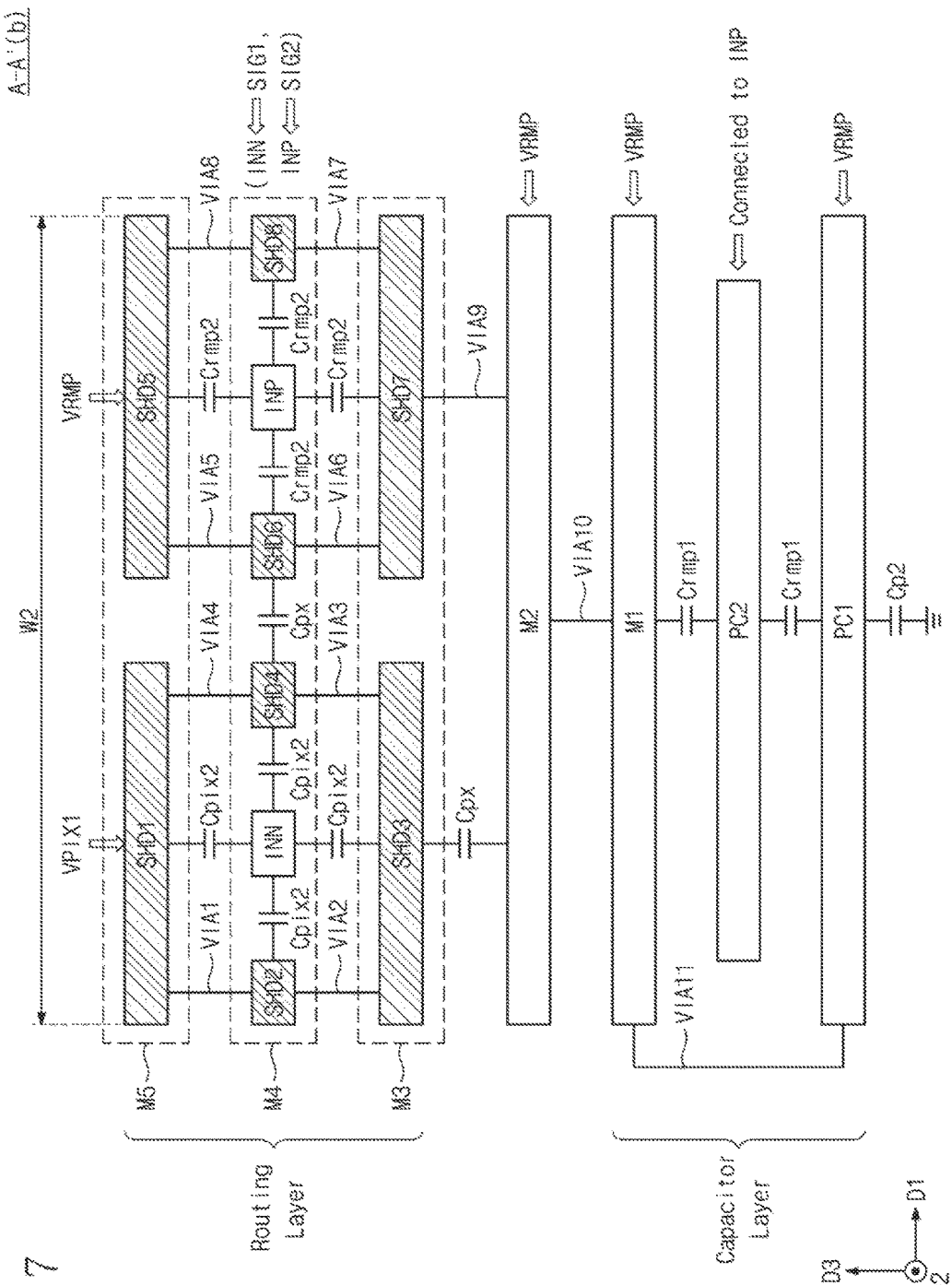
FIG. 7 is a conceptual diagram corresponding to a cross section taken along the line A-A' in FIG. 3 to implement a connection relation of capacitors illustrated in FIG. 6.

FIG. 7 is a conceptual diagram corresponding to a cross section taken along the line A-A' in FIG. 3 to implement a connection relation of capacitors illustrated in FIG. 6. Referring to FIGS. 3, 6 and 7, the first pixel capacitor Cpix1 and the first ramp capacitor Crmp1 of the comparator 151b may be formed on a capacitor layer stacked in the third direction D3. The second pixel Cpix2 and the second ramp capacitor Crmp2 of the comparator 151b may be formed by changing a layout of parasitic capacitors on a routing layer.

FIG. 7 illustrates a conceptual layout and a thickness of each layer may be changed depending on a design. A distance between layers may be changed depending on a design. A width of each layer may be limited within a second width W2. The second width W2 may be set the same as or different from the first width W1 of FIG. 5.

The capacitor layer may be formed to provide the predetermined capacitors (Crmp1, Cpix1). The first ramp capacitor Crmp may be formed between a first poly layer PC1 and a second poly layer PC2 and between the second poly layer PC2 and a first metal layer M1. The first poly layer PC1 and the first metal layer M1 may be connected to each other through an eleventh via VIA11. The ramp signal VRMP may be applied to the first poly layer PC1 and the first metal layer M1. The second poly layer PC2 may be connected to the floating node INP. The second parasitic capacitor Cp2 may be formed between the first poly layer PC1 and the ground terminal.

Although not illustrated in FIG. 7, the first pixel capacitor Cpix1 may be formed similar to the first ramp capacitor Crmp1. The first pixel capacitor Cpix1 may be formed between the first poly layer PC1 and the second poly layer PC2 and between the second poly layer PC2 and the first metal layer M1. The first poly layer PC1 and the first metal layer M1 may be connected to each other through another via. The first pixel signal VPIX may be applied to the first poly layer PC1 and the first metal layer M1. The second poly layer PC2 may be connected to the floating node INN. The first parasitic capacitor Cp1 may be formed between the first poly layer PC1 and the ground terminal. The first pixel capacitor Cpix1 may be disposed parallel to the first ramp capacitor Crmp1 along the second direction D2.

The floating nodes (INN, INP) may be formed on the routing layer. A fourth metal layer M4 may include the floating nodes (INN, INP). A third metal layer M3 may include a third shield line SHD3 and a seventh shield line SHD7. The fourth metal layer M4 may include a second shield line SHD2, a fourth shield line SHD4, a sixth shield line SHD6, and an eighth shield line SHD8. A fifth metal layer M5 may include a first shield line SHD1 and a fifth shield line SHD5.

The floating nodes (INN, INP) may be shielded by the third through fifth metal layers (M3, M4, M5). The floating node INN may be disposed between the first through fourth shield lines (SHD1 to SHD4). The first shield line SHD1 may be connected to the second shield line SHD2 through a first via VIA1. The second shield line SHD2 may be connected to the third shield line SHD3 through a second via VIA2. The third shield line SHD3 may be connected to the fourth shield line SHD4 through a third via VIA3. The fourth shield line SHD4 may be connected to the first shield line SHD1 through a fourth via VIA4. The first pixel signal VPIX1 may be applied to the first through fourth shield lines (SHD1 to SHD4). Because of this, the second pixel capacitor Cpix2 may be formed between the floating node INN and an input stage of the first pixel signal VPIX1.

The floating node INP is disposed between fifth through eighth shield lines (SHD5 to SHD8). The fifth shield line SHD5 may be connected to the sixth shield line SHD6 through a fifth via VIA5. The sixth shield line SHD6 may be connected to the seventh shield line SHD7 through a sixth via VIA6. The seventh shield line SHD7 may be connected to the eighth shield line SHD8 through a seventh via VIA7. The eighth shield line SHD8 may be connected to the fifth shield line SHD5 through an eighth via VIA8. The ramp signal VRMP may be applied to the fifth through eighth shield lines (SHD5 to SHD8). Because of this, the second ramp capacitor Crmp2 may be formed between the floating node INP and an input stage of the ramp signal VRMP.

Because of the layout change, a parasitic capacitor Cpx may be formed between the input stage of the first pixel signal VPIX1 and the input stage of the ramp signal VRMP. The parasitic capacitor Cpx may be formed between the fourth shield line SHD4 and the sixth shield line SHD6. The parasitic capacitor Cpx may be formed between the third shield line SHD3 and the second metal layer M2. However, a reduction of a gain due to the parasitic capacitor Cpx is insignificant.

The second metal layer M2 may be connected to the first metal layer M1 through a tenth via VIA10. The second metal layer M2 may be connected to the seventh shield line SHD7 through a ninth via VIA9.

The comparator 151b may change parasitic capacitors formed on the floating nodes (INN, INP) into the second pixel capacitor Cpix2 and the second ramp capacitor Crmp2 by changing a layout. The second pixel capacitor Cpix2 may be connected in parallel to the first pixel capacitor Cpix1. The second ramp capacitor Crmp2 may be connected in parallel to the first ramp capacitor Crmp1. Thus, capacitance of an input capacitor in the comparator 151b may increase. If the capacitance of the input capacitor increases, transmission efficiency of the comparator 151b may increase.

Figure 8:
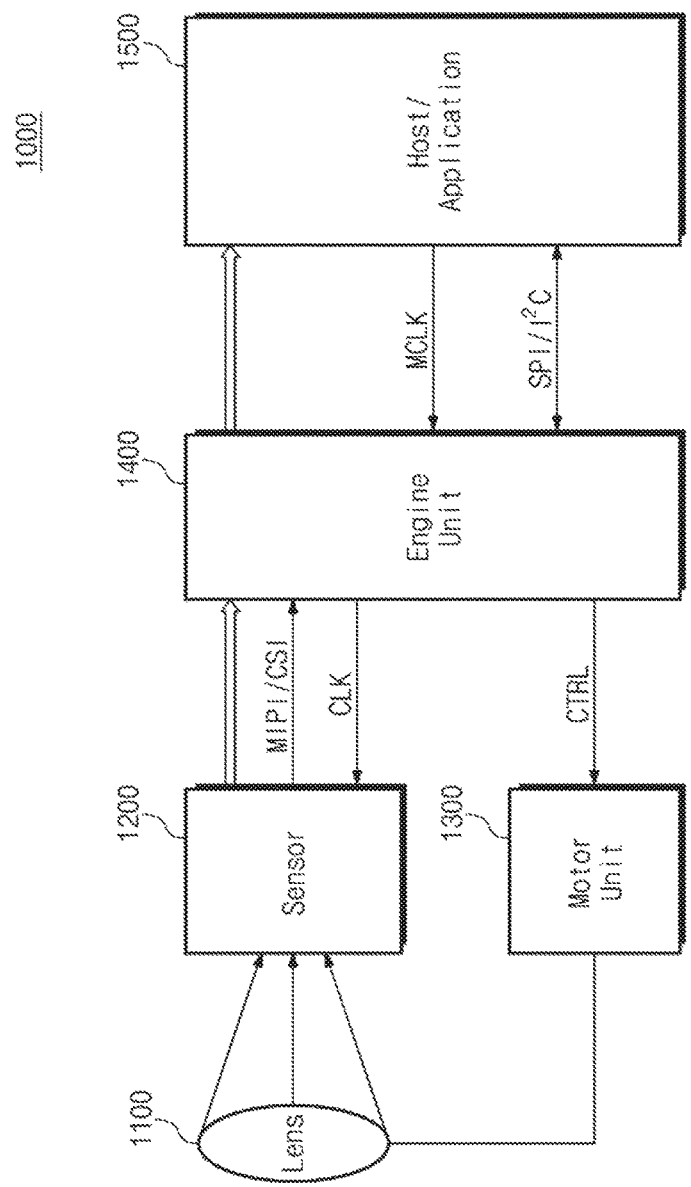
FIG. 8 is a view illustrating a camera system including an image sensor according to an example embodiment.

FIG. 8 is a view illustrating a camera system including an image sensor according to an example embodiment. A camera system 1000 may include a digital camera. Referring to FIG. 8, the camera system 1000 may include a lens 1100, an image sensor 1200, a motor unit 1300, and an engine unit 1400. The image sensor 1200 may include a current stabilizing circuit to prevent an occurrence of a dynamic current according to an example embodiment.

The lens 1100 concentrates an incident light into a light receiving area of the image sensor 1200. The image sensor 1200 may generate RGB data of a Bayer pattern based on the light introduced through the lens 1100. The image sensor 1200 may provide RGB data based on a clock signal CLK. The image sensor 1200 may interface with the engine unit 1400 through a mobile industry processor interface (MIPI) or a camera serial interface (CSI).

The image sensor 1200 may correspond to the image sensor 100 of FIG. 1. The image sensor 1200 may include a comparison circuit that may change a parasitic capacitor into an input capacitor by changing a layout. Thus, the image sensor 1200 may include a comparison circuit having improved transmission efficiency.

The motor unit 1300 may adjust a focus of the lens 1100 or perform a shuttering in response to a control signal CTRL received from the engine unit 1400. The engine unit 1400 controls the image sensor 1200 and the motor unit 1300. The engine unit 1400 may generate YUV data including a luminance component, a difference between the luminance component and a blue component, and a difference between the luminance component and a red component, or generate compressed data (e.g., a joint photography expert group (JPEG)) based on RGB data received from the image sensor 1200.

The engine unit 1400 may be connected to a host/application 1500. The engine unit 1400 may provide YUV data or JPEG data to the host/application 1500 based on a master clock MCLK. The engine unit 1400 may interface with the host/application 1500 through a serial peripheral interface (SPI) or an inter integrated circuit ($I^2C$).

Figure 9:
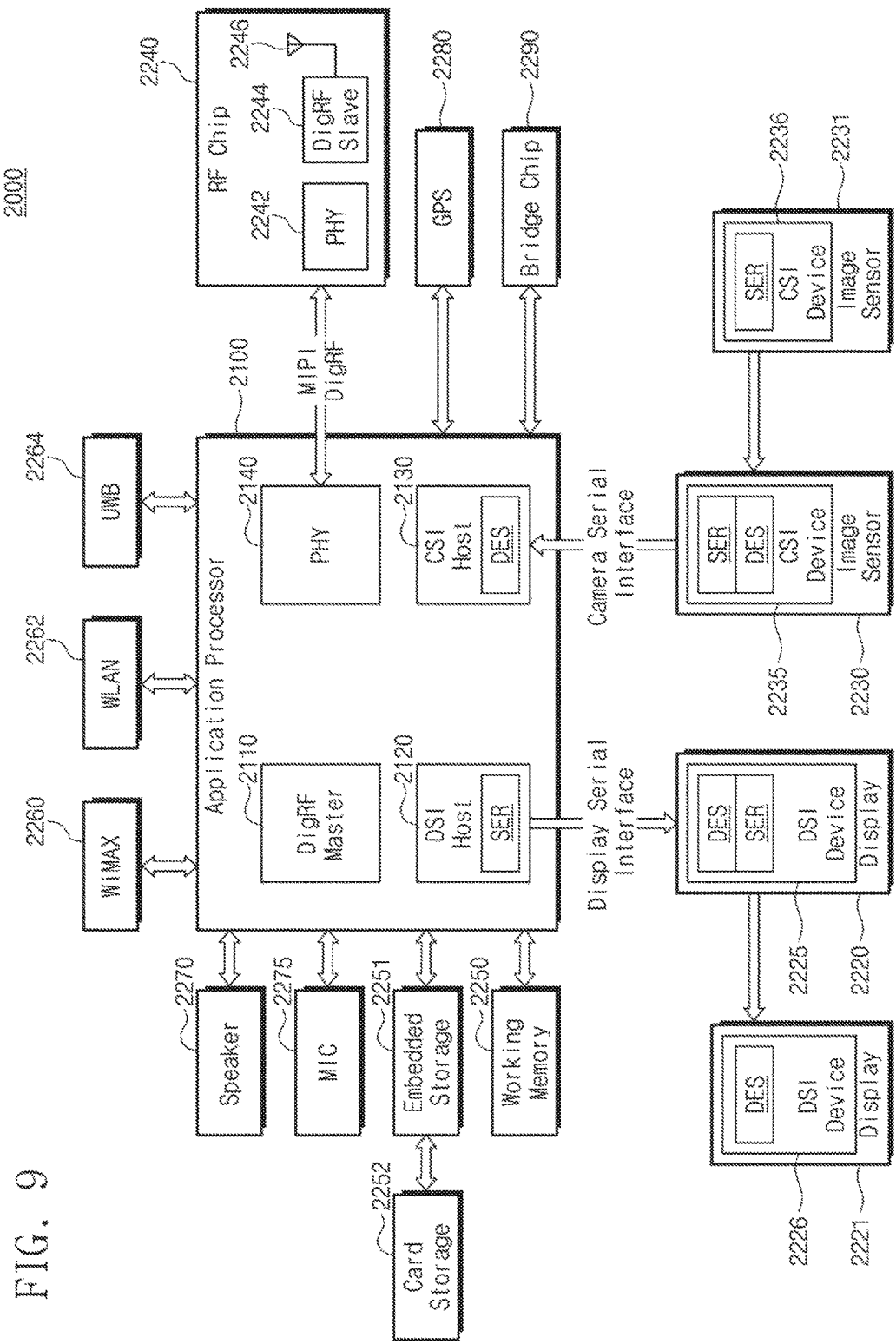
FIG. 9 is a block diagram illustrating a configuration of an electronic device including an image sensor according to an example embodiment and interfaces of the electronic device.

FIG. 9 is a block diagram illustrating a configuration of an electronic device including an image sensor according to an example embodiment and interfaces of the electronic device. An electronic device 2000 may be embodied by a data processing device that can use or support an interface protocol suggested by a MIPI union. The electronic device 2000 may be one of a mobile communication terminal, a personal digital assistant (PDA), a portable media player (PMP), a smart phone, a tablet computer, a wearable device, etc.

The electronic device 2000 may include an application processor 2100, displays 2220 and 2221, and image sensors 2230 and 2231. The application processor 2100 may include a DigRF master 2110, a display serial interface (DSI), a DSI host 2120, a camera serial interface (CSI), and a physical layer 2140.

The DSI host 2120 may communicate with a DSI device 2225 according to DSI. The DSI host 2120 may include an optical serializer SER. The DSI device 2225 may include an optical deserializer DES. The display 2220 may communicate with a DSI device 2226 of the display 2221 according to DSI. The DSI device 2225 may further include an optical serializer SER and the DSI device 2226 may include an optical deserializer DES. The display 2221 may not be directly connected to the application processor 2100.

The application processor 2100 may directly control the DSI device 2226 of the display 2221. The display 2220 may convert a request format received from the application processor 2100 and provide the converted request to the display 2221. The display 2220 may transmit a request including a port identifier to the display 2221. The display 2221 may set or change a communication environment based on the transmitted request.

The CSI host 2130 may communicate with a CSI device 2235 of the image sensor 2230 according to CSI. The CSI host 2130 may include an optical deserializer DES. The CSI device 2235 may include an optical serializer SER. The image sensor 2230 may communicate with a CSI device 2236 of the image sensor 2231 according to CSI. The CSI device 2235 may further include an optical deserializer DES and the CSI device 2236 may include an optical serializer SER. The image sensor 2231 may not be directly connected to the application processor 2100.

The application processor 2100 may directly control the CSI device 2236 of the image sensor 2231. The image sensor 2230 may convert a request format received from the application processor 2100 and provide the converted request to the image sensor 2231. The image sensor 2230 may transmit a request including a port identifier to the image sensor 2231. The image sensor 2231 may set or change a communication environment based on the transmitted request.

The image sensor 2231 may correspond to the image sensor 100 of FIG. 1. The image sensor 2231 may include a comparison circuit that may change a parasitic capacitor into an input capacitor by changing a layout. Thus, the image sensor 2231 may include a comparison circuit having improved transmission efficiency.

The electronic device 2000 may further include a radio frequency (RF) chip 2240 that communicates with the application processor 2100. The RF chip 2240 may include a physical layer 2242, a DigRF slave 2244, and an antenna 2246. The physical layer 2242 of the RF chip 2240 may exchange data with the physical layer 2140 of the application processor 2100 using a DigRF interface suggested by a MIPI union.

The electronic device 2000 may further include a working memory 2250, an embedded storage device 2251, and a card storage device 2252. The working memory 2250, the embedded storage device 2251, and the card storage device 2252 may store data provided from the application processor 2100. Further, the working memory 2250, the embedded storage device 2251, and the card storage device 2252 may provide the stored data to the application processor 2100.

The working memory 2250 may temporarily store data processed or to be processed by the application processor 2100. The working memory 2250 may include a volatile memory such as a static random access memory (SRAM), a dynamic RAM (DRAM), a synchronous DRAM (SDRAM), etc. and/or a nonvolatile memory such as a flash memory, a phase-change RAM (PRAM), a magnetic RAM (MRAM), a resistive RAM (ReRAM), a ferroelectric RAM (FRAM), etc.

The electronic device 2000 may communicate with an external device/system through a communication module such as a word interoperability for microwave access (Wi-MAX) 2260, a wireless local area network (WLAN) 2262, an ultra-wideband (UWB) 2264, etc. In addition, the electronic device 2000 may communicate with an external device/system according to at least one of various wireless communication protocols such as a long term evolution (LTE), a global system for mobile communication (GSM), a code division multiple access (CDMA), a Bluetooth, a near field communication (NFC), a WiFi, a radio frequency Identification (RFID), and/or at least one of various wired communication protocols such as a transfer control protocol/internet protocol (TCP/IP), a universal serial bus (USB), a small computer system interface (SCSI), a mobile PCIe (M-PCIe), a Firewire, etc.

The electronic device 2000 may further include a speaker 2270 and a microphone 2275 for processing voice information. Further, the electronic device 2000 may further include a global positioning system (GPS) 2280 for processing location information. The electronic device 2000 may further include a bridge chip 2290 for managing a connection with peripheral devices.

The electronic device 2000 may communicate with a user adopting various user interfaces. The user interface may include user input interfaces such as a keyboard, a keypad, a button, a touch panel, a touch screen, a touch pad, a touch ball, a camera, a microphone, a gyroscope sensor, a vibration sensor, a piezoelectric element, etc. The user interface may include user output interfaces such as a liquid crystal display (LCD), an organic light emitting diode (OLED) display, an active matrix OLED (AMOLED) display, a LED, a speaker, a motor, etc.

A comparison circuit according to an example embodiment and an image sensor including the comparison circuit may include a capacitor structure that may improve transmission efficiency. According to example embodiments, the comparison circuit may improve transmission efficiency through a layout that makes use of a parasitic capacitor formed at a floating node as an input capacitor.

As is traditional in the field of the inventive concepts, example embodiments are described, and illustrated in the drawings, in terms of functional blocks, units and/or modules. Those skilled in the art will appreciate that these blocks, units and/or modules are physically implemented by electronic (or optical) circuits such as logic circuits, discrete components, microprocessors, hard-wired circuits, memory elements, wiring connections, and the like, which may be formed using semiconductor-based fabrication techniques or other manufacturing technologies. In the case of the blocks, units and/or modules being implemented by microprocessors or similar, they may be programmed using software (e.g., microcode) to perform various functions discussed herein and may optionally be driven by firmware and/or software. Alternatively, each block, unit and/or module may be implemented by dedicated hardware, or as a combination of dedicated hardware to perform some functions and a processor (e.g., one or more programmed microprocessors and associated circuitry) to perform other functions. Also, each block, unit and/or module of the example embodiments may be physically separated into two or more interacting and discrete blocks, units and/or modules without departing from the scope of the inventive concepts. Further, the blocks, units and/or modules of the example embodiments may be physically combined into more complex blocks, units and/or modules without departing from the scope of the inventive concepts.

While the inventive concept has been described with reference to example embodiments, it will be apparent to those skilled in the art that various changes and modifications may be made without departing from the spirit and scope of the inventive concept. Therefore, it should be understood that the above example embodiments are not limiting, but illustrative.

What is claimed is:

1. A comparison circuit comprising:
an amplifier configured to receive a pixel signal and a ramp signal to perform a correlated double sampling operation;
a first pixel capacitor connected to the amplifier through a first floating node and configured to transmit the pixel signal;
a first ramp capacitor connected to the amplifier through a second floating node and configured to transmit the ramp signal;
a second pixel capacitor connected in parallel to the first pixel capacitor; and
a second ramp capacitor connected in parallel to the first ramp capacitor,
wherein the second pixel capacitor is formed between the first floating node and first peripheral routing lines, and the second ramp capacitor is formed between the second floating node and second peripheral routing lines,
wherein a routing layer is stacked on a capacitor layer in a direction perpendicular to a substrate,
wherein the first pixel capacitor and the first ramp capacitor are formed in the capacitor layer, and
wherein the second pixel capacitor, the second ramp capacitor, and the first and second peripheral routing lines are formed in the routing layer.

2. The comparison circuit of claim 1, wherein the first floating node is shielded by the first peripheral routing lines, and
wherein the pixel signal is input to the first peripheral routing lines.

3. The comparison circuit of claim 1, wherein the second floating node is shielded by the second peripheral routing lines, and
wherein the ramp signal is input to the second peripheral routing lines.

4. The comparison circuit of claim 1, wherein the first pixel capacitor and the first ramp capacitor are input capacitors having a predetermined capacitance.

5. The comparison circuit of claim 1, wherein the second pixel capacitor is a parasitic capacitor formed between the first floating node and the first peripheral routing lines, and
wherein the second ramp capacitor is a parasitic capacitor formed between the second floating node and the second peripheral routing lines.

6. The comparison circuit of claim 1, wherein in the capacitor layer, the first pixel capacitor is disposed parallel to the first ramp capacitor in a direction along the substrate.

7. The comparison circuit of claim 1, wherein in the capacitor layer, the first pixel capacitor and the first ramp capacitor are formed by stacking a plurality of conductive layers on the substrate along the direction perpendicular to the substrate, and
wherein a plurality of insulating layers are stacked between the plurality of conductive layers.

8. The comparison circuit of claim 1, wherein a length of the first floating node is the same as a length of the second floating node.

9. An image sensor comprising:
a sensor array configured to convert a light into an electrical signal to generate a pixel signal;
a ramp signal generator configured to generate a ramp signal; and
a comparison circuit configured to receive the pixel signal and the ramp signal to perform a correlated double sampling operation,
wherein the comparison circuit comprises:
an amplifier configured to perform the correlated double sampling operation;
a first pixel capacitor connected to the amplifier through a first floating node and configured to transmit the pixel signal;
a first ramp capacitor connected to the amplifier through a second floating node and configured to transmit the ramp signal;
a second pixel capacitor connected in parallel to the first pixel capacitor; and
a second ramp capacitor connected in parallel to the first ramp capacitor,
wherein the second pixel capacitor is formed between the first floating node and first peripheral routing lines, and the second ramp capacitor is formed between the second floating node and second peripheral routing lines,
wherein a routing layer is stacked on a capacitor layer in a direction perpendicular to a substrate,
wherein the first pixel capacitor and the first ramp capacitor are formed in the capacitor layer, and
wherein the second pixel capacitor, the second ramp capacitor, and the first and second peripheral routing lines are formed in the routing layer.

10. The image sensor of claim 9, wherein the first floating node is shielded by the first peripheral routing lines, and
wherein the pixel signal is input to the first peripheral routing lines.

11. The image sensor of claim 9, wherein the second floating node is shielded by the second peripheral routing lines, and
wherein the ramp signal is input to the second peripheral routing lines.

12. The image sensor of claim 9, wherein the first pixel capacitor and the first ramp capacitor are input capacitors having a predetermined capacitance.

13. The image sensor of claim 9, wherein the second pixel capacitor is a parasitic capacitor formed between the first floating node and the first peripheral routing lines, and
wherein the second ramp capacitor is a parasitic capacitor formed between the second floating node and the second peripheral routing lines.

14. A comparison circuit comprising:
an amplifier configured to receive a pixel signal and a ramp signal to perform a correlated double sampling operation;
an input capacitor comprising a pixel capacitor and a ramp capacitor and having a predetermined capacitance; and
a plurality of parasitic capacitors,
wherein a parasitic capacitor, among the parasitic capacitors, formed at a floating node between the input capacitor and the amplifier is converted into an input capacitor by changing a layout of the comparison circuit to increase capacitance of the input capacitor, the changing the layout of the comparison circuit comprising connecting the parasitic capacitor formed at the floating node in parallel to the input capacitor, wherein a routing layer is stacked on a capacitor layer in a direction perpendicular to a substrate, wherein the pixel capacitor and the ramp capacitor are formed in the capacitor layer, and wherein the parasitic capacitor is formed in the routing layer.

15. The comparison circuit of claim 14, wherein the parasitic capacitor is formed between the floating node and peripheral routing lines.

16. The comparison circuit of claim 14, wherein in the capacitor layer, the pixel capacitor is disposed parallel to the ramp capacitor in a direction along the substrate.

17. The comparison circuit of claim 14, wherein in the capacitor layer, the pixel capacitor and the ramp capacitor are formed by stacking a plurality of conductive layers on the substrate along the direction perpendicular to the substrate, and wherein a plurality of insulating layers are stacked between the plurality of conductive layers.

* * * * *